United States Patent
Kang et al.

(10) Patent No.: US 8,212,247 B2
(45) Date of Patent: Jul. 3, 2012

(54) ORGANIC LIGHT EMITTING DISPLAY DEVICE AND FABRICATING METHOD THEREOF

(75) Inventors: Ki-Nyeng Kang, Yongin (KR); Jae-Seob Lee, Yongin (KR); Dong-Un Jin, Yongin (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 41 days.

(21) Appl. No.: 12/656,264

(22) Filed: Jan. 22, 2010

(65) Prior Publication Data
US 2011/0012104 A1   Jan. 20, 2011

(30) Foreign Application Priority Data
Jul. 15, 2009   (KR) .................. 10-2009-0064373

(51) Int. Cl.
*H01L 21/00* (2006.01)

(52) U.S. Cl. .............. 257/43; 257/40; 257/59; 257/103; 257/E29.26; 257/E33.019; 257/E21.459; 257/E21.158

(58) Field of Classification Search .............. 257/40, 257/43, 59, 103, E29.296, E33.019, E21.459, 257/E21.158
See application file for complete search history.

(56) References Cited

U.S. PATENT DOCUMENTS

| | | | |
|---|---|---|---|
| 6,872,658 B2 | 3/2005 | Arakawa et al. | |
| 2007/0040165 A1 | 2/2007 | Dimmler et al. | |
| 2007/0120143 A1* | 5/2007 | Huh et al. | 257/103 |
| 2008/0116457 A1* | 5/2008 | Park et al. | 257/59 |
| 2008/0121872 A1* | 5/2008 | Choi et al. | 257/40 |
| 2009/0114918 A1 | 5/2009 | Wang et al. | |

FOREIGN PATENT DOCUMENTS

| | | |
|---|---|---|
| JP | 2003-229433 A | 8/2003 |
| JP | 2009-033145 A | 2/2009 |
| KR | 10-2001-0091516 A | 10/2001 |
| WO | WO 2008/145999 A1 | 12/2008 |

* cited by examiner

*Primary Examiner* — Long Pham
(74) *Attorney, Agent, or Firm* — Lee & Morse, P.C.

(57) ABSTRACT

An organic light emitting display includes data lines and scan lines intersecting each other, a scan driving unit for supplying a scan signal to the scan lines, a data driving unit for supplying a data signal to the data lines, and pixels defined at intersection points of the data and scan lines, each pixel having an organic light emitting diode, a first TFT with an inverted staggered top gate structure and connected to the organic light emitting diode, the first TFT including an oxide semiconductor as an active layer, and a second TFT with an inverted staggered bottom gate structure and configured to receive the scan signal from the scan lines, the second TFT including an oxide semiconductor as an active layer.

20 Claims, 4 Drawing Sheets

ORGANIC LIGHT EMITTING DISPLAY DEVICE AND FABRICATING METHOD THEREOF

BACKGROUND

1. Field

Example embodiments relate to an organic light emitting display, and more particularly, to an organic light emitting display having an oxide thin film transistor and a fabricating method thereof.

2. Description of the Related Art

An organic light emitting display is a next generation display having self light emitting characteristics and superior display characteristics, e.g., viewing angle, contrast, response speed, power consumption, and the like, as compared, e.g., to a liquid crystal display (LCD).

The organic light emitting display may include an organic light emitting diode (OLED) having an anode electrode, an organic thin film, and a cathode electrode. The organic light emitting display may be classified as a passive matrix type, i.e., in which the OLEDs are connected to each other between scan lines and signal lines by a matrix method to form pixels, or as an active matrix type, i.e., in which respective pixels are controlled by a thin film transistor (TFT) serving as a switch.

In general, the TFT used in the active matrix type organic light emitting display may include an active layer for providing a channel region, a source region, and a drain region, and a gate electrode formed on the channel region, and may be electrically insulated from the active layer by a gate insulation layer. Such an active layer of the TFT may be generally formed of a semiconductor layer, e.g., an amorphous silicon layer or a poly-silicon layer.

However, when the active layer is formed of amorphous silicon, mobility may be low. Therefore, it may be difficult to implement a driving circuit driven at high speed.

When the active layer is formed of poly-silicon, while mobility may be increased, e.g., as compared to amorphous silicon, a threshold voltage may be not uniform. Therefore, a compensation circuit for compensating distribution of the threshold voltage and the mobility may be needed. However, since an active layer formed of poly-silicon may require a complicated compensation circuit with a plurality of TFTs and capacitors, yield may be low and a resultant planar structure thereof may increase a number of masks used during fabrication thereof, e.g., as compared to a TFT having an active layer of amorphous silicon, so that fabricating costs may increase. Further, a conventional TFT fabricating method using low temperature poly-silicon (LTPS) may have a difficulty to be applied to a large substrate due to required high processing costs, e.g., laser heat treatment, and difficult control thereof.

SUMMARY

Embodiments are therefore directed to an organic light emitting display and a method of fabricating the same, which substantially overcome one or more of the problems due to the limitations and disadvantages of the related art.

It is therefore a feature of an embodiment to provide an organic light emitting display having oxide TFTs with both top and bottom gate structures, so that TFTs having different characteristics may be implemented in a pixel.

It is another feature of an embodiment to provide a method of fabricating an organic light emitting display by forming simultaneously in a same process oxide TFTs with inverted staggered top and bottom gate structures, so that TFTs having different characteristics may be implemented in a same pixel.

At least one of the above and other features and advantages may be realized by providing an organic light emitting display, including source and drain electrodes of a first TFT and a gate electrode which are formed on a substrate, a first insulation layer formed on the source and drain electrodes of the first TFT and the gate electrode of the second TFT, a first via hole formed by removing a part of the first insulation layer that is formed in a region overlapped with the source and drain electrodes of the first TFT, first and second oxide semiconductor layers respectively formed on the first insulation layer overlapped with the source and drain electrodes of the first TFT and the first insulation layer overlapped with the gate electrode of the second TFT, a second insulation layer formed on the first and second oxide semiconductor layers, a second via hole formed by removing a part of the second insulation layer that is formed on the second oxide semiconductor layer, a gate electrode formed on the second insulation layer overlapped with the first oxide semiconductor layer of the first TFT, and source and drain electrodes formed on the second insulation layer to contact the second oxide semiconductor layer through the second via hole.

The first oxide semiconductor layer may contact the source and drain electrodes of the first TFT through the first via hole.

The first TFT may be implemented to have an inverted staggered top gate structure and the second TFT may be implemented to have an inverted staggered bottom gate structure, and the first insulation layer may be a gate insulation of the first TFT and is made of silicon nitride.

The organic light emitting display may further include protective layer and a planarizing layer sequentially formed on the gate electrode of the first TFT and the source and drain electrodes of the second TFT, a third via hole formed in a partial region of the protective layer, the planarizing layer, and the first and second insulation layers such that the source and drain electrodes of the first TFT are exposed, a first electrode of organic light emitting diode connected to the source electrode or the drain electrode through the third via hole, a pixel definition layer formed on the planarizing layer such that a partial region of the first electrode is exposed, and an organic thin layer and a second electrode of the organic light emitting diode sequentially formed on the first exposed electrode.

Here, the first TFT may be a driving device and the second TFT is a switching device.

At least one of the above and other features and advantages may also be realized by providing an organic light emitting display, including pixels including data lines and scan lines that are positioned at every intersecting locations, a plurality of TFTs, and an organic light emitting diode, a scan driving unit for supplying a scan signal to the scan lines, a data driving unit for supplying a data signal to the data lines, wherein each of the pixels includes a first TFT having an active layer that is made of an oxide semiconductor to have an inverted staggered top gate structure and connected to the organic light emitting diode, and a second TFT having an active layer that is made of an oxide semiconductor to have an inverted staggered bottom gate structure and receives the scan signal from the scan lines.

A gate insulation layer of the first TFT may be made of silicon oxide and a gate insulation layer of the second TFT may be made of silicon nitride.

At least one of the above and other features and advantages may also be realized by providing a method of fabricating an organic light emitting display, including forming source and drain electrodes of a first TFT and a gate electrode of a second TFT on a substrate, forming a first insulation layer on the source and drain electrodes of the first TFT and the gate electrode of the second TFT, forming a first via hole by removing a part of the first insulation layer formed in a region that is overlapped with the source and drain electrodes of the first TFT, forming first and second oxide semiconductor layers on the first insulation layer that is overlapped with the source and drain electrodes of the first TFT and on the first insulation layer that is overlapped with the gate electrode of the second TFT, respectively, forming a second insulation layer on the first and second oxide semiconductor layers, forming a second via hole by removing a part of the second insulation layer formed on the second oxide semiconductor layer, forming a gate electrode on the second insulation layer that is overlapped with the first oxide semiconductor layer of the first TFT, and forming source and drain electrodes on the second insulation layer to contact the second oxide semiconductor layer through the second via hole.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0064373, filed on Jul. 15, 2009, in the Korean Intellectual Property Office, and entitled: "Organic Light Emitting Display Device and Fabrication Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, when a first element is described as being coupled to a second element, the first element may be directly coupled to the second element or additional elements may be coupled therebetween via a third element. Also, some of the elements that are not essential to the complete understanding of the embodiments are omitted for clarity. Like reference numerals refer to like elements throughout.

Figure 1A:
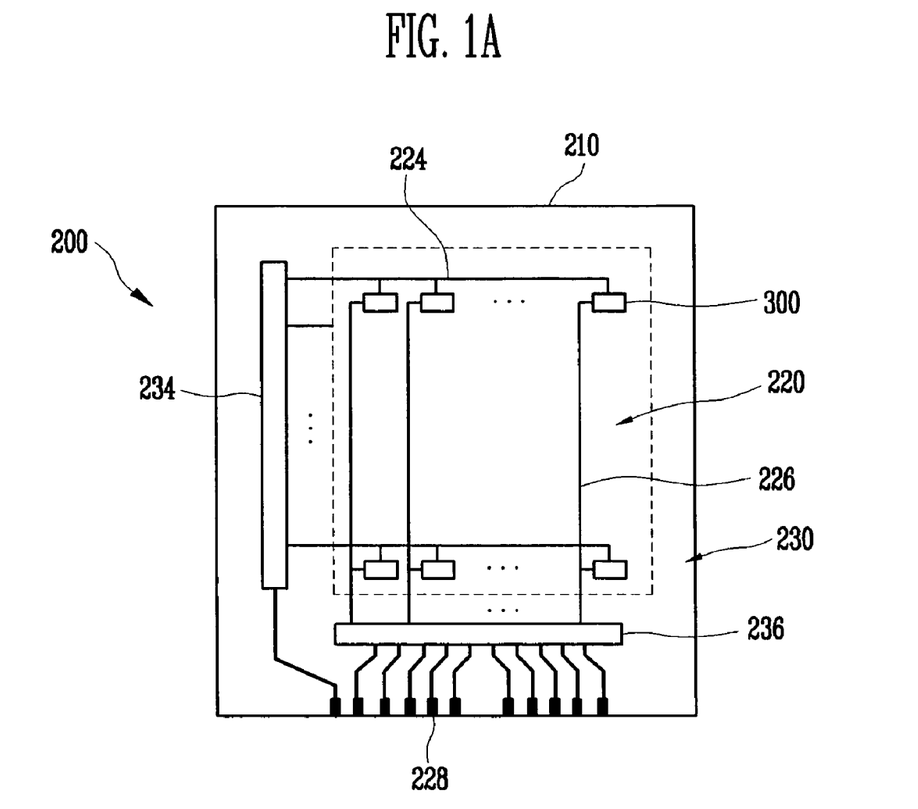
FIGS. 1A and 1B illustrate a plan view and a cross-sectional view, respectively, of an organic light emitting display according to an embodiment.
Figure 1B:
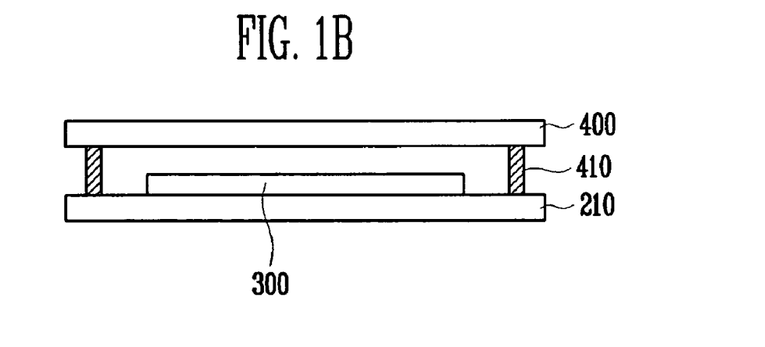

Hereinafter, example embodiment of an organic light emitting display will be described in detail with reference to the accompanying drawings. FIGS. 1A and 1B illustrate a plan view and a cross-sectional view, respectively, of an organic light emitting display according to an embodiment.

Referring to FIG. 1A, an organic light emitting display 200 according to an embodiment may include a substrate 210 defined by a pixel region 220 and a non-pixel region 230 surrounding the pixel region 220. A plurality of pixels 300 connected to each other between scan lines 224 and signal lines 226, e.g., arranged in a matrix pattern, may be formed on the substrate 210 in the pixel region 220. A power supplying line (not shown) for driving the scan lines 224 of the pixel region 220, a scan driving unit 234 connected to the scan lines 224, and a data driving unit 236 for processing a signal provided from the exterior through a pad 228 to provide the processed signal to the scan lines 224 and the signal lines 226 may be formed on the substrate 210 in the non-pixel region 230. The signal lines 226 and scan lines 224 may extend from respective pixels 300, i.e., from the pixel region 220, to the non-pixel region 230. Each of the respective pixels 300 may include a pixel circuit having a plurality of TFTs and at least one OLED connected to the pixel circuit.

In addition, referring to FIG. 1B, an encapsulation substrate 400 for sealing the pixel region 220 may be disposed above the substrate 210 in which the pixels 300 are formed as described above. The encapsulation substrate 400 may be bonded to the substrate 210 by a sealing material 410, so the plurality of pixels 300 may be sealed between the substrate 210 and the encapsulation substrate 400. Each of the plurality of pixels 300, the scan driving unit 234, and the data driving unit 236 which are formed on the substrate 210 may include a plurality of TFTs. Each of the plurality of TFTs may have different characteristics according to performed operations. For example, a pixel 300 may include a TFT operating as a switching device and a TFT operating as a driving device.

According to an embodiment, the different TFTs in the organic light emitting display 200, e.g., the two TFTs in the pixel 300, may include an oxide TFT with an inverted staggered bottom gate structure and an oxide TFT with an inverted staggered top gate structure formed in the same process, so that TFTs with different characteristics may be implemented in a single process. In other words, as opposed to conventional organic light emitting displays, e.g., displays having TFTs with same structures for performing different operations, that include TFTs having no substantial difference in their characteristics, TFTs according to example embodiments may have different structures that are formed in a single process, thereby facilitating improvement of different characteristics for the different TFTs. For example, since the TFTs according to example embodiments have different structures, it may be possible to provide in a single process improved On-Off characteristics in TFTs operating as switching devices and high reliability in TFTs operating as driving devices.

Figure 2:
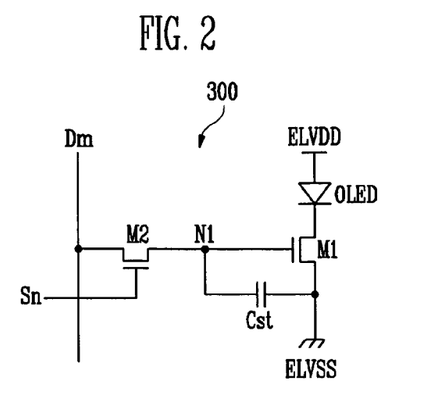
FIG. 2 illustrates a circuit diagram of a pixel in FIGS. 1A-1B.

FIG. 2 illustrates a circuit diagram of the pixel 300 according to an embodiment. It is noted, however, that the pixel circuit in FIG. 2 is only an example embodiment and other pixel circuits for the organic light emitting display 200 are included within the scope of the inventive concept.

Referring to FIG. 2, the pixel circuit of the pixel 300 may include a first TFT M1 as a driving TFT, a second TFT M2 as a switching TFT, and a capacitor Cst. The first TFT M1 and the second TFT M2 may be oxide TFTs.

In particular, according to example embodiments, the first TFT M1, which operates as a driving device, may be implemented into an inverted staggered top gate structure, and the second TFT M2, which operates as a switching device, may be implemented into an inverted staggered bottom gate structure. It is noted, however, that even though the first and second TFTs M1 and M2 are illustrated as N-type TFTs in FIG. 2, other types of TFTs are included within the scope of the inventive concept.

Each of the first and second TFTs M1 and M2 may include a source, a drain, and a gate electrode. The source and drain may be physically identical to each other so, hereinafter, they will be referred to as a first electrode and a second electrode, respectively. The capacitor Cst may include a first electrode and a second electrode.

Referring to FIG. 2, in the first TFT M1, the first electrode may be connected to a cathode electrode of the OLED, and the second electrode may be connected to a second power source ELVSS. The gate electrode may be connected to a first node N1.

In the second TFT M2, the first electrode may be connected to a data line Dm, the second electrode may be connected to the first node N1, and the gate electrode may be connected to a scan line Sn. Therefore, a data signal selectively flowing through the data line Dm may be selectively transmitted to the first node N1 in accordance with a scan signal transmitted through the scan line Sn.

In the capacitor Cst, the first electrode may be connected to the second power source ELVSS, and the second electrode may be connected to the first node N1. Therefore, a voltage between the gate electrode and the second electrode, i.e., source, of the first TFT M1 is maintained for a predetermined time, and a corresponding current flows through the OLED to emit light.

According to embodiments, the first TFT M1 may be fabricated with an oxide semiconductor to have an inverted staggered top gate structure. A gate insulation layer may be formed in the inverted staggered top gate structure between the gate electrode and the oxide semiconductor layer, e.g., a silicon oxide ($SiO_2$) layer. Therefore, reliability of the first TFT M1 may be improved to have proper characteristics as a driving device.

Further, according to embodiments, the second TFT M2 may be fabricated with an oxide semiconductor to have an inverted staggered bottom gate structure. A gate insulation layer may be formed in the inverted staggered bottom gate structure between the gate electrode and the oxide semiconductor layer, e.g., a silicon nitride ($SiN_x$) layer. Therefore, On-Off performance of the second TFT M2 may be improved to have proper characteristics as a switching device.

Moreover, the first and second TFTs M1 and M2 may be fabricated, e.g., simultaneously, in the same process. Therefore, as the first and second TFTs M1 and M2 may have top and bottom gate structures, respectively, TFTs having different characteristics may be implemented in a single process without adding a mask process.

Figure 3:
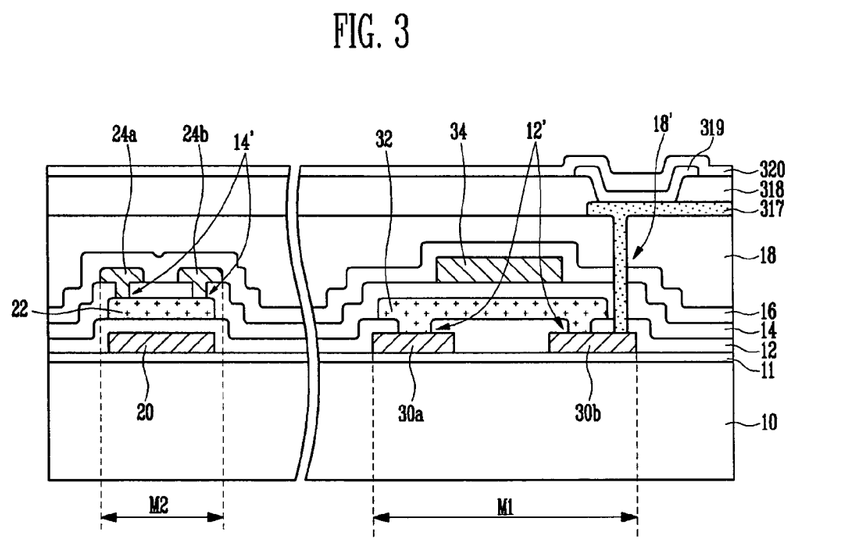
FIG. 3 illustrates a cross-sectional view of a first TFT and second TFT in FIG. 2.

FIG. 3 illustrates a cross-sectional view of the first TFT M1 and the OLED connected thereto (from FIG. 2), and the second TFT M2. The first TFT M1 and the second TFT M2 will be described as an oxide TFT with an inverted staggered top gate structure and as an oxide TFT with an inverted staggered bottom gate structure, respectively.

Referring to FIG. 3, a buffer layer 11 may be formed on a substrate 10. On the buffer layer 11, the source electrode 30a and the drain electrode 30b of the first TFT M1 and the gate electrode 20 of the second TFT M2 may be formed. The gate electrode 20 may be spaced apart from the source and drain electrodes 30a and 30b, i.e., the first and second TFTs M1 and M2 may be spaced apart from each other. The gate electrode 20 and the source and drain electrodes 30a and 30b may be formed on a substantially same level, e.g., the gate electrode 20 and the source and drain electrodes 30a and 30b may be formed directly on the buffer level 11.

After that, a first insulation layer 12 may be formed on, e.g., directly on, the source electrode 30a and the drain electrode 30b of the first TFT M1 and the gate electrode 20 of the second TFT M2. A portion of the first insulation layer 12 overlapping the source and drain electrodes 30a and 30b of the first TFT M1 may be removed, e.g., via an etching process, so that a via hole 12' may be formed. For example, a portion of the first insulation layer 12 may be removed to expose a portion of an upper surface of each of the source and drain electrodes 30a and 30b through a respective via hole 12'.

First and second oxide semiconductor layers 32 and 22 may be formed on, e.g., directly on, the first insulation layer 12 overlapped with the source and drain electrodes 30a and 30b of the first TFT M1 and the gate electrode 20 of the second TFT M2. The first and second oxide semiconductor layers 32 and 22 may be formed of, e.g., a GaLnZnO (GIZO) layer having zinc oxide (ZnO) as a main component doped with gallium (Ga) and indium (In).

For example, the first oxide semiconductor layer 32 may overlap the first insulation layer 12 and the source and drain electrodes 30a and 30b, so that a portion of the first oxide semiconductor layer 32 may fill the via hole 12', e.g., directly contact the source and drain electrodes 30a and 30b. The source and drain electrodes 30a and 30b of the first TFT M1 may electrically contact the first oxide semiconductor layer 32 through the via hole 12'.

The second oxide semiconductor layer 22 may overlap the first insulation layer 12 and the gate electrode 20 of the second TFT M2, so that the first insulation layer 12 may be between the second oxide semiconductor layer 22 and the gate electrode 20. That is, the first insulation layer 12 formed in the region of the second TFT M2 may operate as a gate insulation layer of the second TFT M2.

The first insulation layer 12 may be made of, e.g., silicon nitride ($SiN_x$). As such, the gate insulation layer of the second TFT M2 implemented by the inverted staggered bottom gate structure may be made of silicon nitride, so that the On-Off characteristics of the second TFT M2 may be improved.

In general, since silicon nitride has excellent electric insulation properties, break down voltage (Vbd) of a silicon nitride layer may be superior to that of a silicon oxide layer ($SiO_2$). Therefore, when the gate insulation layer of the second TFT M2, which has an inverted staggered bottom gate structure, is made of silicon nitride, the On-Off characteristics ($I_{on/off}$) of the second TFT M2 may be improved. By doing so, the second TFT M2 may be implemented as a switching device.

Next, a second insulation layer 14 may be formed on the first and second oxide semiconductor layers 32 and 22. A portion of the second insulation layer 14 formed on the second oxide semiconductor layer 22 overlapping the source and drain electrode 24a and 24b of the second TFT M2 may be removed, e.g., via etching, so that a via hole 14' may be formed to expose portions of the upper surface of the second oxide semiconductor layer 22.

After that, a gate electrode 34 may be formed on the second insulation layer 14 to overlap the first oxide semiconductor layer 32 of the first TFT M1. That is, the second insulation layer 14 formed in the first TFT M1 may operate as a gate insulation layer of the first TFT M1. The source electrode 24a and the drain electrode 24b may be formed on the second insulation layer 14 of the second TFT M2 to contact the second oxide semiconductor layer 22 through the via hole 14'.

The second insulation layer 14 may be made of, e.g., silicon oxide ($SiO_2$). The gate insulation layer of the first TFT M1 implemented by the inverted staggered top gate structure may be made of silicon oxide, so that reliability of the first TFT M1 may be improved.

In general, since silicon oxide has a lower hydrogen content than silicon nitride, reliability may be improved when a silicon oxide layer is used as a gate insulation layer. Therefore, when the gate insulation layer of the first TFT M1 implemented by the inverted staggered top gate structure is made of the silicon oxide, the reliability may be improved, and the first TFT M1 may be implemented as a driving device.

Next, a protective layer 16 may be formed on the gate electrode 34 of the first TFT M1 and the source and drain electrodes 24a and 24b of the second TFT M2. A planarizing layer 18 may be formed on the protective layer 16 to provide a planarized surface above the first and second TFTs M1 and M2.

Next, a via hole 18' may be formed through the planarizing layer 18, protective layer 16, and the first and second insulation layers 12 and 14, such that the source or drain electrode 30a or 30b of the first TFT M1 may be exposed. A first electrode 317 may be formed on the planarizing layer 18, and may be connected to the exposed source or drain electrode 30a or 30b through the via hole 18'.

A pixel definition layer 318 may be formed on the planarizing layer 18, such that a partial region (light emitting region) of the first electrode 317 may be exposed and an organic thin layer 319 may be formed on the exposed first electrode 317. A second electrode 320 may be formed on the pixel definition layer 318 including the organic thin layer 319.

FIGS. 4A to 4D illustrate cross-sectional views of stages in a process of fabricating the first TFT M1 and the OLED connected thereto, and the second TFT M2, which are illustrated in FIG. 3.

Figure 4A:
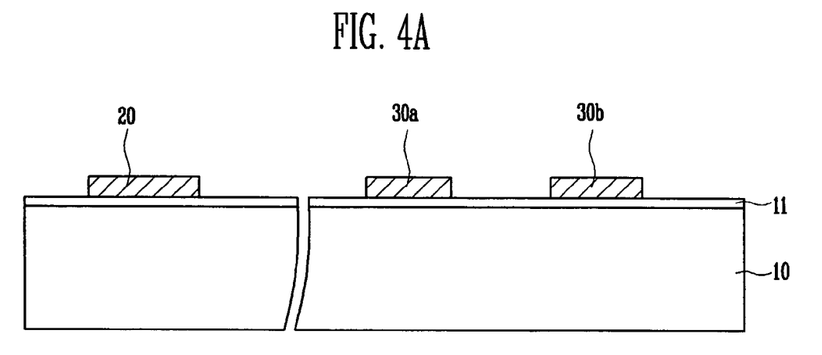
FIGS. 4A to 4D illustrate cross-sectional views of stages in a process of fabricating the first and second TFTs, as well as the OLED connected thereto, in FIG. 3.

Firstly, referring to FIG. 4A, the buffer layer 11 may be formed on the substrate 10. The source and drain electrode 30a and 30b of the first TFT M1 and the gate electrode 20 of the second TFT M2 may be formed, e.g., simultaneously, on the buffer layer 11.

Figure 4B:
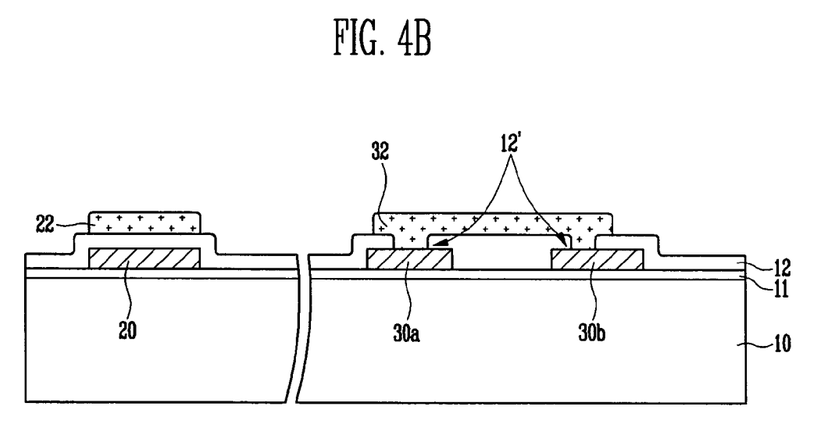

After that, as illustrated in FIG. 4B, the first insulation layer 12 may be formed on, e.g., to cover, the source and drain electrodes 30a and 30b of the first TFT M1 and the gate electrode 20 of the second TFT M2. The part of the first insulation layer 12 formed in a region that may be overlapped with the source and drain electrodes 30a and 30b of the first TFT M1 may be removed during the etching process so that the via hole 12' may be formed.

The first and second oxide semiconductor layers 32 and 22 may be formed on a portion of the first insulation layer 12 overlapping the source and drain electrode 30a and 30b of the first TFT M1 and on a portion of the first insulation layer 12 overlapping the gate electrode 20 of the second TFT M2, respectively. The source and drain electrodes 30a and 30b of the first TFT M1 may electrically contact the first oxide semiconductor layer 32 through the via hole 12'. The first and second oxide semiconductor layers 32 and 22 may be made of, e.g., GaLnZnO (GIZO) layer having zinc oxide (ZnO) as a main component doped with gallium (Ga) and indium (In).

The first insulation layer 12 in the second TFT M2 may operate as a gate insulation layer of the second TFT M2. The first insulation layer 12 may made of silicon nitride ($SiN_x$). The gate insulation layer of the second TFT M2 implemented by the inverted staggered bottom gate structure may be made of silicon nitride, so that the On-Off characteristics of the second TFT M2 may be improved.

In general, since the silicon nitride layer has excellent electric insulation, break down voltage (Vbd) of the silicon nitride layer may be superior to that of the silicon oxide layer ($SiO_2$). Therefore, when the gate insulation layer of the second TFT M2 implemented by the inverted staggered bottom gate structure is made of silicon nitride, the On-Off characteristics ($I_{on/off}$) may be improved. By doing so, the second TFT M2 may be implemented as a switching device.

Figure 4C:
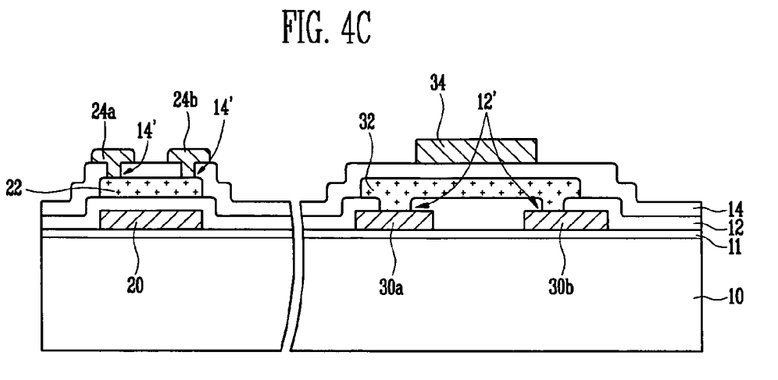

Next, referring to FIG. 4C, the second insulation layer 14 may be formed on the first and second oxide semiconductor layers 32 and 22. A part of the second insulation layer 14 formed on the second oxide semiconductor 22 and overlapping the source and drain electrodes 24a and 24b of the second TFT M2 may be removed during the etching process, so that the via hole 14' may be formed.

After that, the gate electrode 34 may be formed on a portion of the second insulation layer 14 overlapping the first oxide semiconductor layer 32 of the first TFT M1. The source electrode 24a and the drain electrode 24b may be formed on the second insulation layer 14 of the second TFT M2 to contact the second oxide semiconductor layer 22 through the via hole 14'.

The second insulation layer 14 formed in the first TFT M1 may operate as a gate insulation layer of the first TFT M1. The second insulation layer 14 may be made of, e.g., silicon oxide ($SiO_2$). As such, the gate insulation layer of the first TFT M1 implemented by the inverted staggered top gate structure may be made of silicon oxide, so that reliability of the first TFT M1 may be improved.

In general, since the silicon oxide has lower hydrogen content than silicon nitride, the reliability may be improved when a silicon oxide layer is used as a gate insulation layer. Therefore, when the gate insulation layer of the first TFT M1 implemented by the inverted staggered top gate structure is made of silicon oxide, the reliability may be improved, and the first TFT M1 may be implemented as a driving device.

Figure 4D:
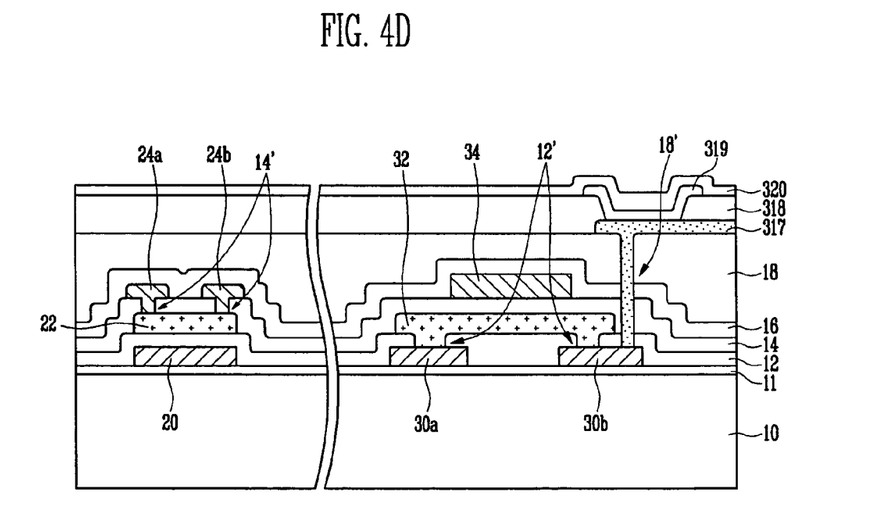

Next, referring to FIG. 4D, the protective layer 16 may be formed on the gate electrode 34 of the first TFT M1 and the source and drain electrodes 24a and 24b of the second TFT M2, and the planarizing layer 18 may be formed on the protective layer 16 for the surface planarization.

Moreover, the via hole 18' may be formed in the protective layer 16, the planarizing layer 18, and the first and second insulation layers 12 and 14, such that the source or drain electrode 30a or 30b of the first TFT M1 may be exposed. The first electrode 317 of the OLED connected to the source or drain electrode 30a or 30b through the via hole 18' may be formed.

The pixel definition layer 318 may be formed on the planarizing layer 18, such that a partial region (light emitting region) of the first electrode 317 may be exposed and the organic thin layer 319 may be formed on the exposed first electrode 317. The second electrode 320 may be formed on the pixel definition layer 318 including the organic thin layer 319.

According to example embodiments, a pixel of an organic light emitting display may include a first oxide TFT with an inverted staggered top gate structure, in which a silicon oxide gate insulation layer may be formed between a gate electrode and an oxide semiconductor layer, and a second oxide TFT with an inverted staggered bottom gate structure, in which a silicon nitride gate insulation layer may be formed between a gate electrode and an oxide semiconductor layer. The first and second TFTs may have opposite structures formed simultaneously via a same process, so each of the first and second TFTs may have different characteristics and improved performance with respect to a different operation. That is, the first TFT may have improved on-off characteristics as a switching device, due to the silicon nitride layer, and the second TFT may have improved reliability as a driving device due to the silicon oxide layer. By doing so, desired characteristics of a TFT may be implemented without changing a size of the TFT.

Moreover, as the first and second TFTs according to example embodiments are formed in the same process, different characteristics corresponding to different operations of TFTs may be implemented without adding a mask process. In contrast, when a conventional pixel, i.e., a pixel having same structures of TFTs as opposed to having TFTs of both top and bottom gate structures, includes TFTs with, e.g., zinc oxide (ZnO) as the active layer, the ZnO in the TFT may substantially modify TFT characteristics based on structure thereof, thereby limiting the TFTs to N-type TFTs. Moreover, when implementing a conventional TFT with ZnO as an active layer in an inverted staggered bottom gate structure, i.e., in view of characteristics and uniformity of the TFT, field effect mobility may be as low as 20 cm$^2$/Vs, thereby reducing integration degree in a display panel below a degree of the conventional amorphous silicon TFT and poly-silicon TFT.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display, comprising:
   source/drain electrodes of a first thin film transistor (TFT) and a gate electrode of a second TFT on a substrate;
   a first insulation layer on the source/drain electrodes of the first TFT and on the gate electrode of the second TFT, the first insulation layer including a first via hole therethrough exposing portions of the source/drain electrodes of the first TFT;
   first and second oxide semiconductor layers on the first insulation layer, the first and second oxide semiconductor layers overlapping the source/drain electrodes of the first TFT and the gate electrode of the second TFT, respectively;
   a second insulation layer on the first and second oxide semiconductor layers, the second insulation layer including a second via hole therethrough exposing a portion of the second oxide semiconductor layer;
   a gate electrode on the second insulation layer, the gate electrode overlapping the first oxide semiconductor layer of the first TFT; and
   source/drain electrodes on the second insulation layer to contact the second oxide semiconductor layer through the second via hole.

2. The organic light emitting display as claimed in claim 1, wherein the first oxide semiconductor layer contacts the source and drain electrodes of the first TFT through the first via hole.

3. The organic light emitting display as claimed in claim 1, wherein the first TFT has an inverted staggered top gate structure and the second TFT has an inverted staggered bottom gate structure.

4. The organic light emitting display as claimed in claim 1, wherein the first insulation layer is a gate insulation of the second TFT, the first gate insulation layer including silicon nitride.

5. The organic light emitting display as claimed in claim 4, wherein the second insulation layer is a gate insulation layer of the first TFT, the second gate insulation layer including silicon oxide.

6. The organic light emitting display as claimed in claim 1, further comprising:
   a protective layer and a planarizing layer sequentially stacked on the gate electrode of the first TFT and on the source/drain electrodes of the second TFT;
   a first electrode of an organic light emitting diode connected to the source/drain electrodes of the first TFT via a third via hole, the third via hole extending through the protective layer, planarizing layer, and first and second insulation layers;
   a pixel definition layer on the planarizing layer exposing the first electrode of the organic light emitting diode; and
   an organic thin layer and a second electrode of the organic light emitting diode sequentially stacked on the first exposed electrode.

7. The organic light emitting display as claimed in claim 6, wherein the first TFT is a driving device and the second TFT is a switching device.

8. An organic light emitting display, comprising:
   data lines and scan lines intersecting each other;
   a scan driving unit for supplying a scan signal to the scan lines;
   a data driving unit for supplying a data signal to the data lines; and
   pixels defined at intersection points of the data and scan lines, each pixel including:
   an organic light emitting diode,
   a first thin film transistor (TFT) with an inverted staggered top gate structure and connected to the organic light emitting diode, the first TFT including an oxide semiconductor as an active layer, and
   a second TFT with an inverted staggered bottom gate structure and configured to receive the scan signal from the scan lines, the second TFT including an oxide semiconductor as an active layer; and wherein:
   the first TFT includes first source/drain electrodes, a first insulation layer, a first oxide semiconductor layer, a second insulation layer, and a first gate electrode sequentially stacked on a substrate, and
   the second TFT includes a second gate electrode, the first insulation layer, a second oxide semiconductor layer, the second insulation layer, and second source/drain electrodes sequentially stacked on the substrate, the first and second insulation layers being common to the first and second TFTs.

9. The organic light emitting display as claimed in claim 8, wherein a gate insulation layer of the first TFT includes silicon oxide.

10. The organic light emitting display as claimed in claim 8, wherein a gate insulation layer of the second TFT includes silicon nitride.

11. The organic light emitting display as claimed in claim 8, wherein the second insulation layer is a gate insulation layer of the first TFT and includes silicon oxide.

12. The organic light emitting display as claimed in claim 11, wherein the first insulation layer is a gate insulation layer of the second TFT and includes silicon nitride.

13. The organic light emitting display as claimed in claim 8, wherein:
   the first TFT includes first source/drain electrodes and the second TFT includes a second gate electrode; and the first source/drain electrodes of the first TFT and the second gate electrode of the second TFT are located above, and directly contact, the same layer.

14. A method of fabricating an organic light emitting display, comprising: forming source/drain electrodes of a first thin film transistor (TFT) and a gate electrode of a second TFT on a substrate;

forming a first insulation layer on the source and drain electrodes of the first TFT and on the gate electrode of the second TFT;

forming a first via hole by removing a part of the first insulation layer, such that the first via hole exposes portions of the source/drain electrodes of the first TFT;

forming first and second oxide semiconductor layers on the first insulation, such that the first and second oxide semiconductor layers overlap the source/drain electrodes of the first TFT and the gate electrode of the second TFT, respectively;

forming a second insulation layer on the first and second oxide semiconductor layers; forming a second via hole by removing a part of the second insulation layer to expose a portion of the second oxide semiconductor layer;

forming a gate electrode on the second insulation layer, such that the gate electrode overlaps the first oxide semiconductor layer of the first TFT; and forming source/drain electrodes on the second insulation layer, such that the source/drain electrodes contact the second oxide semiconductor layer through the second via hole.

15. The method as claimed in claim 14, wherein the first oxide semiconductor layer is formed to contact the source/drain electrodes of the first TFT through the first via hole.

16. The method as claimed in claim 14, wherein the first insulation layer is a gate insulation layer of the second TFT and is made of silicon nitride.

17. The method as claimed in claim 14, wherein the second insulation layer is a gate insulation layer of the first TFT and is made of silicon oxide.

18. The method as claimed in claim 14, further comprising: sequentially forming a protective layer and a planarizing layer on the gate electrode of the first TFT and the source and drain electrodes of the second TFT;

forming a third via hole in a partial region of the protective layer, the planarizing layer, and the first and second insulation layers such that the source or drain electrode of the first TFT is exposed;

forming a first electrode of an organic light emitting diode connected to the source or drain electrode through the third via hole;

forming a pixel definition layer on the planarizing layer, such that a partial region of the first electrode is exposed; and sequentially forming an organic thin layer and a second electrode of the organic light emitting diode on the first exposed electrode.

19. The method as claimed in claim 14, wherein the first and second TFTs are formed simultaneously using same processing steps.

20. The method as claimed in claim 19, wherein the first TFT is formed to have an inverted staggered top gate structure and the second TFT is formed to have an inverted staggered bottom gate structure.

\* \* \* \* \*